United States Patent
Hirabayashi

(10) Patent No.: US 12,187,918 B2
(45) Date of Patent: Jan. 7, 2025

(54) METHOD OF MANUFACTURING GALLIUM OXIDE SUBSTRATE AND POLISHING SLURRY FOR GALLIUM OXIDE SUBSTRATE

(71) Applicant: AGC Inc., Tokyo (JP)

(72) Inventor: Yusuke Hirabayashi, Tokyo (JP)

(73) Assignee: AGC INC., Tokyo (JP)

( * ) Notice: Subject to any disclaimer, the term of this patent is extended or adjusted under 35 U.S.C. 154(b) by 183 days.

(21) Appl. No.: 17/481,256

(22) Filed: Sep. 21, 2021

(65) Prior Publication Data

US 2022/0002589 A1 Jan. 6, 2022

Related U.S. Application Data

(63) Continuation of application No. PCT/JP2019/050180, filed on Dec. 20, 2019.

(30) Foreign Application Priority Data

Mar. 27, 2019 (JP) .................. 2019-061748

(51) Int. Cl.
*C09G 1/02* (2006.01)
*C09K 3/14* (2006.01)
*C23F 3/00* (2006.01)

(52) U.S. Cl.
CPC .............. *C09G 1/02* (2013.01); *C09K 3/1409* (2013.01); *C09K 3/1463* (2013.01); *C23F 3/00* (2013.01)

(58) Field of Classification Search
None
See application file for complete search history.

(56) References Cited

U.S. PATENT DOCUMENTS

| | | | |
|---|---|---|---|
| 9,318,339 B2 | 4/2016 | Sato et al. | |
| 2012/0001193 A1* | 1/2012 | Sano | B24B 37/0056 451/364 |
| 2013/0012102 A1* | 1/2013 | Yamaguchi | C09K 3/1463 451/36 |
| 2014/0242750 A1 | 8/2014 | Sato et al. | |
| 2014/0248775 A1* | 9/2014 | Yoshida | C09K 3/1463 438/692 |
| 2015/0354058 A1 | 12/2015 | Morinaga et al. | |
| 2016/0083675 A1* | 3/2016 | Morita | C11D 3/30 438/687 |

(Continued)

FOREIGN PATENT DOCUMENTS

| | | |
|---|---|---|
| CN | 104919076 A | 9/2015 |
| JP | 2008-105883 A | 5/2008 |
| JP | 2009091212 A * | 4/2009 |

(Continued)

OTHER PUBLICATIONS

International Searching Authority, "International Search Report," in connection with International Patent Application No. PCT/JP2019/050180, dated Feb. 10, 2020.

(Continued)

*Primary Examiner* — Stephanie P Duclair
(74) *Attorney, Agent, or Firm* — Foley & Lardner LLP

(57) ABSTRACT

A method of manufacturing a gallium oxide substrate includes polishing the gallium oxide substrate with a polishing slurry, wherein the polishing slurry contains manganese dioxide particles and water.

22 Claims, 7 Drawing Sheets

(56) References Cited

U.S. PATENT DOCUMENTS

2021/0024781 A1* 1/2021 Oda .................... C09G 1/02

FOREIGN PATENT DOCUMENTS

| JP | 2015-189806 A | 11/2015 |
| --- | --- | --- |
| JP | 2017-071787 A | 4/2017 |
| WO | WO-2019/188747 A1 | 10/2019 |

OTHER PUBLICATIONS

International Searching Authority, "Written Opinion," in connection with International Patent Application No. PCT/JP2019/050180, dated Feb. 10, 2020.

* cited by examiner

METHOD OF MANUFACTURING GALLIUM OXIDE SUBSTRATE AND POLISHING SLURRY FOR GALLIUM OXIDE SUBSTRATE

CROSS-REFERENCE TO RELATED APPLICATIONS

This U.S. non-provisional application is a continuation of PCT International Application PCT/JP2019/050180 filed on Dec. 20, 2019 and designated the U.S., which is based on and claims priority to Japanese Patent Applications No. 2019-061748 filed on Mar. 27, 2019, with the Japan Patent Office. The entire contents of these applications are incorporated herein by reference.

BACKGROUND OF THE INVENTION

1. Field of the Invention

The present invention relates to a method of manufacturing a gallium oxide substrate and a polishing slurry for a gallium oxide substrate.

2. Description of the Related Art

In recent years, it has been proposed to use compound semiconductor substrates in place of silicon semiconductor substrates. Compound semiconductors include silicon carbide, gallium nitride, gallium oxide, and the like. Compound semiconductors are superior to silicon semiconductors in that compound semiconductors have a larger band gap. A compound semiconductor substrate is polished, and an epitaxial film is formed on the polished surface.

Japanese Patent Application Laid-Open No. 2008-105883 discloses a polishing method for gallium oxide substrates. In this polishing method, a polishing slurry containing diamond particles and a polishing slurry containing colloidal silica are used in this order. This polishing method is described as being able to form steps and terraces on the principal plane of a gallium oxide single crystal.

Japanese Patent Application Laid-Open No. 2017-71787 discloses a method for substrates formed of silicon carbide or gallium nitride. In this polishing method, a polishing slurry is used that contains oxidizable particles or metal elements that can take on multiple oxidation numbers. As a specific example of oxidizing particles, Japanese Patent Application Laid-Open No. 2017-71787 discloses manganese oxide articles, and also discloses that manganese dioxide particles with high oxidizing power are particularly suitable.

Japanese Patent Application Laid-Open No. 2015-189806 discloses the polishing of silicon substrates with abrasive grains containing manganese dioxide. The paragraph [0033] of Japanese Patent Application Laid-Open No. 2015-189806 describes the polishing mechanism of silicon substrates. According to the description, in order to polish silicon substrates at a high rate, it is important to polish the substrates in an alkaline environment, and abrasive grains used for polishing the substrates do not dissolve in an alkaline environment. Therefore, in Japanese Patent Application Laid-Open No. 2015-189806, manganese dioxide is only mentioned as one example of abrasive grains that do not dissolve in an alkaline environment, and there is no suggestion of using manganese dioxide abrasive grains for polishing gallium oxide substrates.

SUMMARY OF THE INVENTION

Technical Problem

In Japanese Patent Application Laid-Open No. 2008-105883, a polishing slurry containing diamond particles and a polishing slurry containing colloidal silica are used in this order. In this case, it was difficult for the colloidal silica to sufficiently remove the damage caused by the diamond particles. It should be noted that there has been a problem when only the polishing slurry containing colloidal silica is used in that the polishing speed is too low.

In Japanese Patent Application Laid-Open No. 2017-71787, a polishing slurry containing manganese dioxide particles is used. Manganese dioxide particles are described as having high abrasive power on silicon carbide or gallium nitride because of their high oxidizing power. On the other hand, gallium oxide is not capable of improving the polishing speed by using the oxidizing power of the particles because gallium oxide is an oxide.

One aspect of the present disclosure provides a technique that can both improve the polishing speed of gallium oxide substrates and reduce damage of the substrates.

Solution to Problem

A method of manufacturing a gallium oxide substrate according to one embodiment of the present disclosure includes polishing the gallium oxide substrate with a polishing slurry, wherein the polishing slurry contains manganese dioxide particles and water.

Effect of Invention

One embodiment of the present disclosure provides a technique that can both improve the polishing speed of gallium oxide substrates and reduce damage of the substrates.

DETAILED DESCRIPTION OF THE PREFERRED EMBODIMENTS

Hereinafter, embodiments of the present disclosure are described below with reference to the drawings. In the crystallographic descriptions in the present specification, individual orientation is denoted by [ ], collective orientation is denoted by < >, individual faces are denoted by ( ), and collective faces are denoted by { }. A negative crystallographic index is usually expressed by placing a bar over the number, but in the present specification, a negative crystallographic index is expressed by placing a negative sign in front of the number.

Figure 1:
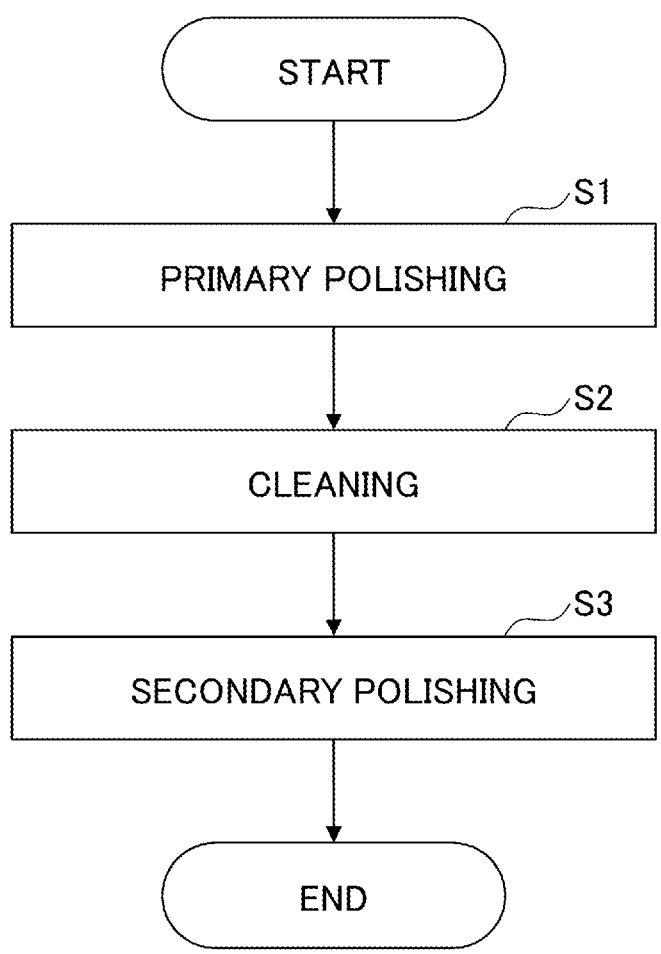
FIG. 1 is a flowchart illustrating a method of manufacturing a gallium oxide substrate according to one embodiment of the invention.

FIG. 1 illustrates a flowchart of a method of manufacturing a gallium oxide substrate according to one embodiment. As illustrated in FIG. 1, the method for manufacturing the gallium oxide substrate includes primary polishing (S1) of the gallium oxide substrate using a primary polishing slurry. As a gallium oxide substrate, for example, a β-$Ga_2O_3$ single crystal is sliced into a plate shape beforehand using a wire saw or the like, and then ground to a predetermined thickness using a grinding device or the like. The gallium oxide substrate may or may not contain a dopant. As the dopant, for example, Si, Sn, Al, or In is used.

The gallium oxide substrate is formed in the shape of a disk, and notches and the like indicating the crystal orientation of gallium oxide are formed on the periphery of the gallium oxide substrate. Instead of a notch, an orientation flat may be formed. The gallium oxide substrate has a first principal plane and a second principal plane that are parallel to each other. The first principal plane is the principal plane to be polished by a primary polishing slurry. The first principal plane is, for example, a {001} plane. The {001} plane is a crystal plane perpendicular to the <001> direction, and can be either the (001) plane or the (00-1) plane.

The first principal plane may be a crystal plane other than the {001} plane. The first principal plane may also have what is known as an off-angle with respect to a predetermined crystal plane. The off-angle improves the crystallinity of the epitaxial film formed on the first principal plane after polishing. Not only the first principal plane, but also the second principal plane may be polished with the primary polishing slurry.

The primary polishing slurry contains manganese dioxide ($MnO_2$) particles and water. Manganese dioxide particles are the dispersoid, and water is the dispersion medium. Manganese dioxide has a lower Mohs hardness and a higher polishing speed than general abrasives such as diamond, silica, and the like, which will be discussed in detail later.

It is presumed that a chemical reaction between manganese dioxide and gallium oxide occurs during polishing because the polishing speed is high, despite of the low Mohs hardness. It is presumed that the chemical reaction weakens the bond between the oxygen and gallium that constitute gallium oxide, resulting in increasing in the polishing speed of gallium oxide.

As mentioned above, manganese dioxide has a lower Mohs hardness and a higher polishing speed than general abrasives such as diamond, silica, and the like. Therefore, both increasing the polishing speed of gallium oxide substrates and reducing damage of the substrates can be achieved. The damage is, for example, cracks or scratches. The damage depth formed by diamond particles is about 15 μm, and the damage depth formed by manganese dioxide particles is 2 μm or less.

In addition to manganese dioxide ($MnO_2$), manganese monoxide (MnO), manganese dioxide trioxide ($Mn_2O_3$), manganese trioxide ($Mn_3O_4$), and the like can be listed as manganese oxides, but among these, manganese dioxide ($MnO_2$) has a particularly high polishing speed. Details will be discussed later.

The amount of manganese dioxide particles in the primary polishing slurry is, for example, 0.01% by mass or more and 50% by mass or less. When the aforementioned amount is 0.01% by mass or more, the polishing speed is high. The aforementioned amount is preferably 0.1% by mass or more, and more preferably 0.5% by mass or more. When the aforementioned amount is 20% by mass or less, the material cost of the primary polishing slurry is low. The aforementioned amount is preferably 40% by mass or less, and more preferably 20% by mass or less.

In addition to the manganese dioxide particles, the primary polishing slurry may contain additional particles of other materials. The particles of other materials are added to the extent that the particles of other materials do not reduce the polishing speed and do not increase damage. The particles of other materials include, for example, colloidal silica particles.

The pH of the primary polishing slurry is not particularly limited from the viewpoint of polishing speed, but from the viewpoint of dispersibility, the pH is either preferably 1 or more and 3 or less, or 7 or more and 14 or less. When the pH is 1 or more and 3 or less, the zeta potential of the particles becomes positive. The absolute value of the zeta potential of the particles is large, resulting in causing the particle repulsion and improving dispersibility. The pH is preferably 1 or more and 2 or less. When the pH is 7 or more and 14 or less, the zeta potential of the particles becomes negative. The absolute value of the zeta potential of the particles is large, resulting in causing the particle repulsion and improving dispersibility. If the dispersibility is good, the storage of slurry become easier. The pH is preferably 8 or more and 14 or less.

The primary polishing slurry may contain a pH adjuster to adjust the pH of the slurry. As pH adjusters, for example, nitric acid ($HNO_3$), sodium hydroxide (NaOH), or the like can be used. The pH adjuster also acts as a dispersing agent. The dispersing agent increases the dispersibility of the manganese dioxide particles. The primary polishing slurry may also contain general dispersants.

The diameter at which the cumulative volume is 50%, i.e. D50, in the particle size distribution of the manganese dioxide particles measured by a dynamic light scattering method is 1 nm or more and 2000 nm or less. The dynamic light scattering method is a method of measuring the particle size distribution by irradiating the primary polishing slurry with laser light and observing the scattered light with a photodetector. When the D50 is 1 nm or more, the polishing speed is high. The D50 is preferably 50 nm or more. When D50 is 2000 nm or less, the surface roughness of the first principal plane after polishing is small and the damage of substrates is also small. The D50 is preferably 1000 nm or less. In the polishing of gallium oxide substrates, the inventors assume that gallium oxide and manganese dioxide react chemically with each other, resulting in progressing the polishing at a high speed.

The method of manufacturing a gallium oxide substrate includes cleaning (S2) of the gallium oxide substrate with a cleaning liquid after primary polishing (S1). The cleaning liquid washes away the manganese dioxide particles that adhere to the gallium oxide substrate. Therefore, scratches and other defects caused by the primary polishing (S1) can be removed in the secondary polishing (S3) described below because the manganese dioxide particles used in the primary polishing (S1) do not remain on the substrate.

The cleaning liquid contains, for example, at least one of ascorbic acid or erythorbic acid, and has a pH of 6 or less. This cleaning liquid can dissolve the manganese dioxide particles and can remove them by a chemical reaction.

The cleaning liquid may contain at least one of sulfuric acid ($H_2SO_4$) or hydrochloric acid (HCl), and may also contain hydrogen peroxide ($H_2O_2$). This cleaning liquid is also capable of dissolving the manganese dioxide particles and can remove them by a chemical reaction.

The method of manufacturing a gallium oxide substrate includes polishing (S3) of the gallium oxide substrate using a secondary polishing slurry. The D50 of the particles of the secondary polishing slurry is smaller than the D50 of the particles of the primary polishing slurry. The material of the particles of the secondary polishing slurry may be the same or different from the material of the particles of the primary polishing slurry. In the latter case, for example, colloidal silica is used.

EXAMPLES

Hereinafter, Examples and Comparative Examples are described. Of the following Examples 1 to 18, Examples 1 to 9 are Examples, and Examples 10 to 18 are Comparative Examples.

Example 1

In Example 1, the (001) plane of a $\beta$-$Ga_2O_3$ single crystal substrate was polished using a single-sided polishing machine. The single-sided polishing system used was a product name NF-300 manufactured by Nano Factor Co., Ltd. The diameter of the rotating surface plate of the single-sided polishing machine was 300 mm. The polishing pad to be attached to the rotating surface plate was the trade name N0571 manufactured by FILWEL Corporation. The polishing pressure was set to 113 g/cm² and the rotation speed of the rotary surface plate was set to 40 rpm. These polishing conditions were the same for Examples 1 to 18.

In Example 1, an abrasive slurry containing 1% by mass of $MnO_2$ particles and 99% by mass of water was used. The $MnO_2$ particles were the product name MNO02PB manufactured by High Purity Research Institute Co. Ltd. The pH of the polishing slurry was 6.7, and the D50 of the $MnO_2$ particles was 1.6 µm. The D50 of the $MnO_2$ particles was measured by a dynamic light scattering method. The dynamic light scattering method is a method to measure the particle size distribution by irradiating the abrasive slurry with laser light and observing the scattered light with a photodetector. The polishing speed was determined based on the difference in thickness before versus after polishing and the polishing time, and the polishing speed was 11.7 µm/h.

Example 2

In Example 2, the (001) plane of a $\beta$-$Ga_2O_3$ single crystal substrate was polished in the same conditions as in Example 1, except that the amount of $MnO_2$ particles in the polishing slurry was increased to 2% by mass and the water content was reduced to 98% by mass. The pH of the polishing slurry was 6.5, the D50 of the $MnO_2$ particles was 1.6 µm, and the polishing speed was 16.8 µm/h.

Example 3

In Example 3, the (001) plane of a $\beta$-$Ga_2O_3$ single crystal substrate was polished in the same conditions as in Example 1, except that the amount of $MnO_2$ particles in the polishing slurry was increased to 5% by mass and the water content was reduced to 95% by mass. The pH of the polishing slurry was 6.5, the D50 of the $MnO_2$ particles was 1.6 µm, and the polishing speed was 12.3 µm/h.

Example 4

In Example 4, the (001) plane of a $\beta$-$Ga_2O_3$ single crystal substrate was polished in the same conditions as in Example 1, except that the amount of $MnO_2$ particles in the polishing slurry was increased to 10% by mass and the water content was reduced to 90% by mass. The pH of the polishing slurry was 6.0, the D50 of the $MnO_2$ particles was 1.6 µm, and the polishing speed was 15.1 µm/h.

Example 5

In Example 5, the (001) plane of a $\beta$-$Ga_2O_3$ single crystal substrate was polished in the same conditions as in Example 1, except that the amount of $MnO_2$ particles in the polishing slurry was increased to 20% by mass and the water content was reduced to 80% by mass. The pH of the polishing slurry was 5.6, the D50 of the $MnO_2$ particles was 1.6 µm, and the polishing speed was 8.5 µm/h.

Example 6

In Example 6, the (001) plane of a $\beta$-$Ga_2O_3$ single crystal substrate was polished in the same conditions as in Example 1, except that the amount of $MnO_2$ particles in the polishing slurry was increased to 5% by mass, NaOH was added as a pH adjuster, and the rest was constituted by water. The pH of the polishing slurry was 10.2, the D50 of the $MnO_2$ particles was 0.2 µm, and the polishing speed was 9.9 µm/h.

Example 7

In Example 7, the (001) plane of a $\beta$-$Ga_2O_3$ single crystal substrate was polished in the same conditions as in Example 1, except that the amount of $MnO_2$ particles in the polishing slurry was increased to 5% by mass, NaOH was added as a pH adjuster, and the rest was constituted by water. The pH of the polishing slurry was 7.7, the D50 of the $MnO_2$ particles was 0.2 µm, and the polishing speed was 12.4 µm/h.

Example 8

In Example 8, the (001) plane of a $\beta$-$Ga_2O_3$ single crystal substrate was polished in the same conditions as in Example 1, except that the amount of $MnO_2$ particles in the polishing slurry was increased to 5% by mass, $HNO_3$ was added as a pH adjuster, and the rest was constituted by water. The pH of the polishing slurry was 4.7, the D50 of the $MnO_2$ particles was 3.3 µm, and the polishing speed was 8.3 µm/h.

Example 9

In Example 9, the (001) plane of a $\beta$-$Ga_2O_3$ single crystal substrate was polished in the same conditions as in Example 1, except that the amount of $MnO_2$ particles in the polishing slurry was increased to 5% by mass, $HNO_3$ was added as a pH adjuster, and the rest was constituted by water. The pH of the polishing slurry was 2.2, the D50 of the $MnO_2$ particles was 0.4 µm, and the polishing speed was 7.2 µm/h.

Example 10

In Example 10, the (001) plane of a $\beta$-$Ga_2O_3$ single crystal substrate was polished in the same conditions as in Example 1, except that the polishing slurry containing 1% by mass of diamond particles and 99% by mass of water was used. For the diamond particles, the product name MD500 manufactured by Tomei Diamond Corporation was used. The pH of the polishing slurry was 6.0, the D50 of the diamond particles was 0.5 μm, and the polishing speed was 5.4 μm/h.

Example 11

In Example 11, the (001) plane of a β-$Ga_2O_3$ single crystal substrate was polished in the same conditions as in Example 1, except that the polishing slurry containing 10% by mass of $SiO_2$ particles and 90% by mass of water was used. For the $SiO_2$ particles, the trade name COMPOL80 manufactured by Fujimi Inc. was used. The pH of the polishing slurry was 10.0, the D50 of the $SiO_2$ particles was 0.1 μm, and the polishing speed was 0.4 μm/h.

Example 12

In Example 12, the (001) plane of a β-$Ga_2O_3$ single crystal substrate was polished in the same conditions as in Example 1, except that the polishing slurry containing 10% by mass of $Mn_2O_3$ particles and 90% by mass of water was used. For the $Mn_2O_3$ particles, the product name MNO04PB manufactured by High Purity Research Institute Co., Ltd. was used. The pH of the polishing slurry was 7.0, and the polishing speed was 1.0 μm/h.

Example 13

In Example 13, the (001) plane of a β-$Ga_2O_3$ single crystal substrate was polished in the same conditions as in Example 1, except that the polishing slurry containing 10% by mass of $Mn_3O_4$ particles and 90% by mass of water was used. For the $Mn_3O_4$ particles, the product name MNO05PB manufactured by High Purity Research Institute Co., Ltd. was used. The pH of the polishing slurry was 6.2, and the polishing speed was 0.4 μm/h.

Example 14

In Example 14, the (001) plane of a β-$Ga_2O_3$ single crystal substrate was polished in the same conditions as in Example 1, except that the polishing slurry containing 10% by mass of MnO particles and 90% by mass of water was used. For the MnO particles, the product name MNO01PB manufactured by High Purity Research Institute Co., Ltd. was used. The pH of the polishing slurry was 7.0, and the polishing speed was 2.1 μm/h.

Example 15

In Example 15, the (001) plane of a β-$Ga_2O_3$ single crystal substrate was polished in the same conditions as in Example 1, except that the polishing slurry containing 10% by mass of $TiO_2$ particles and 90% by mass of water was used. For the $TiO_2$ particles, the product name TIO21PB manufactured by High Purity Research Institute Co., Ltd. was used. The pH of the polishing slurry was 6.0, the D50 of the $TiO_2$ particles was 0.6 μm, and the polishing speed was 0.8 μm/h.

Example 16

In Example 16, the (001) plane of a β-$Ga_2O_3$ single crystal substrate was polished in the same conditions as in Example 1, except that the polishing slurry containing 10% by mass of $ZrO_2$ particles and 90% by mass of water was used. For the $ZrO_2$ particles, the product name ZRO02PB manufactured by High Purity Research Institute Co., Ltd. was used. The pH of the polishing slurry was 4.2, the D50 of the $ZrO_2$ particles was 1.7 μm, and the polishing speed was 0.6 μm/h.

Example 17

In Example 17, the (001) plane of a β-$Ga_2O_3$ single crystal substrate was polished in the same conditions as in Example 1, except that the polishing slurry containing 10% by mass of $Fe_2O_3$ particles and 90% by mass of water was used. For the $Fe_2O_3$ particles, the product name FEO10PB manufactured by High Purity Research Institute Co., Ltd. was used. The pH of the polishing slurry was 5.5, and the polishing speed was 0.7 μm/h.

Example 18

In Example 18, the (001) plane of a β-$Ga_2O_3$ single crystal substrate was polished in the same conditions as in Example 1, except that the polishing slurry containing 10% by mass of ZnO particles and 90% by mass of water was used. For the ZnO particles, the product name ZNO06PB manufactured by High Purity Research Institute Co., Ltd. was used. The pH of the polishing slurry was 7.0, and the polishing speed was 0.1 μm/h.

[Analysis of Results in Examples 1 to 18]

The polishing conditions and results in Examples 1 to 18 are indicated in Table 1. In Table 1, "D" in the column indicated "Particle Material" refers to diamond.

TABLE 1

| | Partcle material | Dispersion medium | pH adjuster | pH | Amount of particle [% by mass] | D50 [μm] | Polishing speed [μm/h] | Damage depth [μm] |
|---|---|---|---|---|---|---|---|---|
| Example 1 | $MnO_2$ | Pure water | None | 6.7 | 1 | 1.6 | 11.7 | — |
| Example 2 | $MnO_2$ | Pure water | None | 6.5 | 2 | 1.6 | 16.8 | — |
| Example 3 | $MnO_2$ | Pure water | None | 6.5 | 5 | 1.6 | 12.3 | — |
| Example 4 | $MnO_2$ | Pure water | None | 6.0 | 10 | 1.6 | 15.1 | 1 |
| Example 5 | $MnO_2$ | Pure water | None | 5.6 | 20 | 1.6 | 8.5 | — |
| Example 6 | $MnO_2$ | Pure water | NaOH | 10.2 | 5 | 0.2 | 9.9 | 0.8 |
| Example 7 | $MnO_2$ | Pure water | NaOH | 7.7 | 5 | 0.2 | 12.4 | — |
| Example 8 | $MnO_2$ | Pure water | $HNO_3$ | 4.7 | 5 | 3.3 | 8.3 | — |
| Example 9 | $MnO_2$ | Pure water | $HNO_3$ | 2.2 | 5 | 0.4 | 7.2 | — |
| Example 10 | D | Pure water | None | 6.0 | 1 | 0.5 | 5.4 | 15 |
| Example 11 | $SiO_2$ | Pure water | None | 10.0 | 10 | 0.1 | 0.4 | — |
| Example 12 | $Mn_2O_3$ | Pure water | None | 7.0 | 10 | — | 1.0 | — |

TABLE 1-continued

|  | Partcle material | Dispersion medium | pH adjuster | pH | Amount of particle [% by mass] | D50 [μm] | Polishing speed [μm/h] | Damage depth [μm] |
|---|---|---|---|---|---|---|---|---|
| Example 13 | $Mn_3O_4$ | Pure water | None | 6.2 | 10 | — | 0.4 | — |
| Example 14 | MnO | Pure water | None | 7.0 | 10 | — | 2.1 | — |
| Example 15 | $TiO_2$ | Pure water | None | 6.0 | 10 | 0.6 | 0.8 | — |
| Example 16 | $ZrO_2$ | Pure water | None | 4.2 | 10 | 1.7 | 0.6 | — |
| Example 17 | $Fe_2O_3$ | Pure water | None | 5.5 | 10 | — | 0.7 | — |
| Example 18 | ZnO | Pure water | None | 7.0 | 10 | — | 0.1 | — |

The "damage depth" indicated in Table 1 was measured using the following method. First, the polished (001) plane was observed under an optical microscope, and the positions of the cracks and scratches caused by polishing were recorded. Then, the (001) plane was re-polished with colloidal silica for about 0.2 μm until the cracks and scratches disappeared at the recorded positions, and the presence or absence of cracks and scratches at the recorded positions was checked with an optical microscope. The cumulative amount of polishing until cracks and scratches were disappeared at the recorded positions was measured as the damage depth. As can be seen from Table 1, the damage depth formed by diamond particles was about 15 μm, while that by manganese dioxide particles was 2 μm or less.

Figure 2:
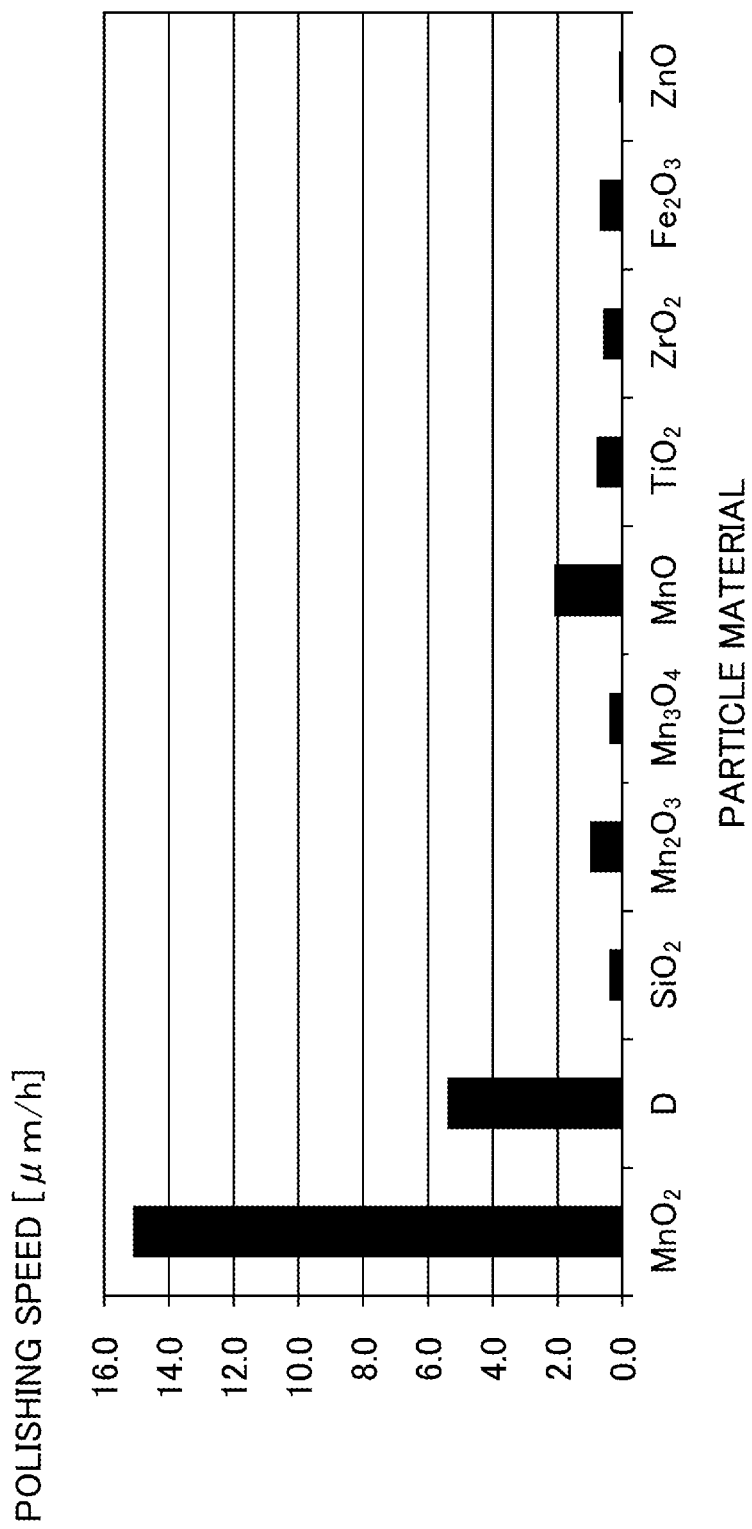
FIG. 2 is a figure illustrating the relationship between the particle materials and the polishing speed in Example 4 and Examples 10 to 18.

FIG. 2 illustrates the relationship between the particle materials and the polishing speed in Example 4 and Examples 10 to 18. As can be seen from Table 1, Example 4 and Examples 10 to 18 have in common that these Examples did not use a pH adjuster and differ in terms of the type of particle materials. The difference in pH is mainly due to the difference in the particle materials because these Examples did not use the pH adjuster in Example 4 and Examples 10 to 18. In addition, Example 4 and Examples 11 to 18 also have in common that the amounts of particles were set to 10% by mass, as can be seen from Table 1.

As can be seen from FIG. 2, $MnO_2$ had a higher polishing speed than the general abrasives such as diamond and $SiO_2$. In addition, the polishing speed of $MnO_2$ was also higher than that of MnO, $Mn_2O_3$, and $Mn_3O_4$. Furthermore, $MnO_2$ had a higher polishing speed than the oxides of transition metals other than manganese ($TiO_2$, $ZrO_2$, $Fe_2O_3$, and ZnO).

Figure 3:
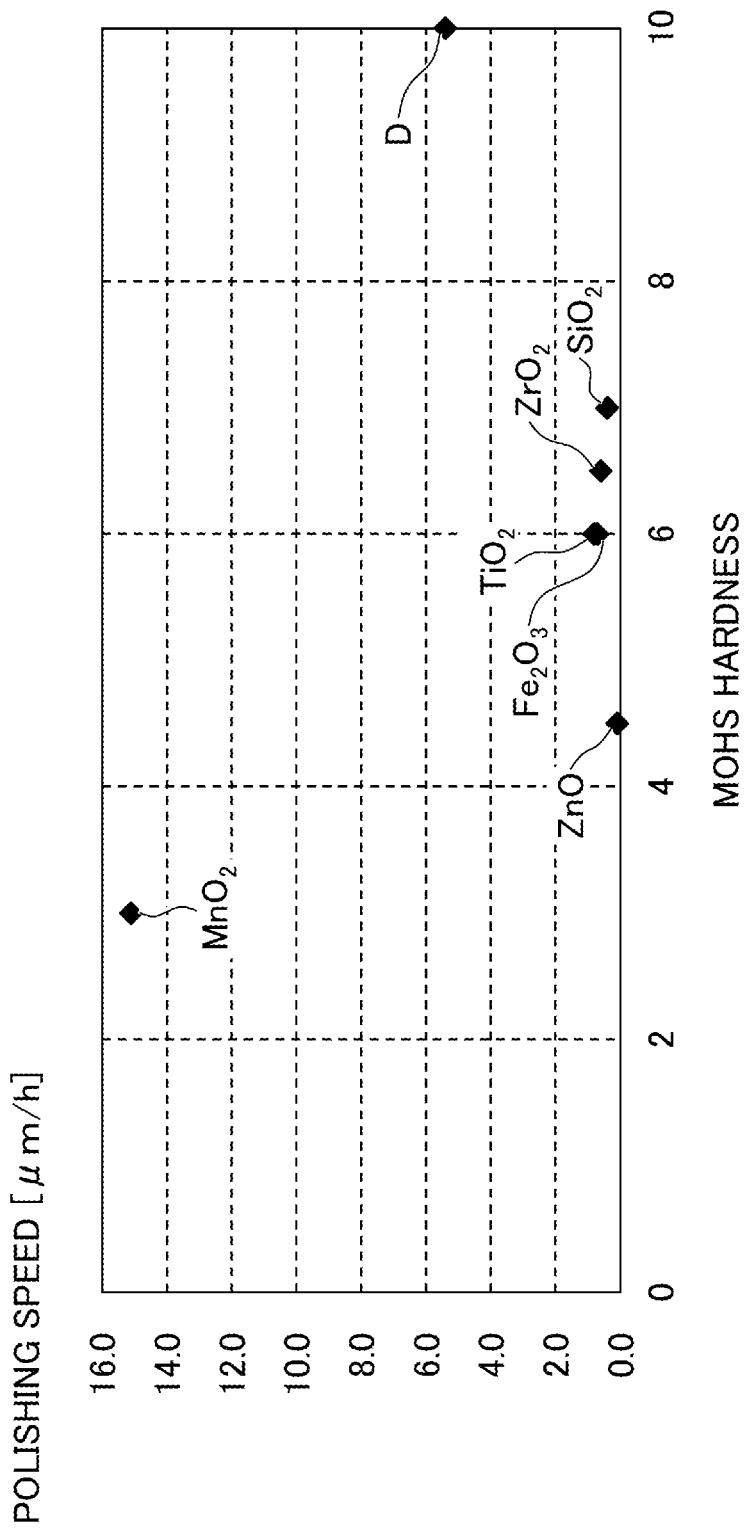
FIG. 3 is a figure illustrating the relationship of the particle materials, the polishing speed, and Mohs hardness in Example 4, Examples 10 to 11, and Examples 15 to 18.

The relationship between the particle materials, polishing speed, and Mohs hardness is indicated in Table 2 and FIG. 3. Table 2 and FIG. 3 indicate the relationship of the particle materials, polishing speed, and Mohs hardness in Examples 4, Examples 10 to 11, and Examples 15 to 18.

TABLE 2

|  | Particle material | Polishing speed [μm/h] | Mohs hardness |
|---|---|---|---|
| Example 4 | $MnO_2$ | 15.1 | 3 |
| Example 10 | D | 5.4 | 10 |
| Example 11 | $SiO_2$ | 0.4 | 7 |
| Example 15 | $TiO_2$ | 0.8 | 6 |
| Example 16 | $ZrO_2$ | 0.6 | 6.5 |
| Example 17 | $Fe_2O_3$ | 0.7 | 6 |
| Example 18 | ZnO | 0.1 | 4.5 |

As can be seen in Table 2 and FIG. 3, $MnO_2$ had a higher polishing speed than the general abrasives such as diamond and $SiO_2$, despite the lower Mohs hardness of $MnO_2$. In addition, the polishing speed of $MnO_2$ was higher than that of the oxides of transition metals other than manganese ($TiO_2$, $ZrO_2$, $Fe_2O_3$, and ZnO), despite the lower Mohs hardness of $MnO_2$.

It is presumed that a chemical reaction between $MnO_2$ and $Ga_2O_3$ occurs during polishing because the polishing speed is high, despite of the low Mohs hardness. It is presumed that the chemical reaction weakens the bond between the oxygen and gallium that constitute $Ga_2O_3$, resulting in increasing in the polishing speed of $Ga_2O_3$.

It should be noted that MnO, $Mn_2O_3$, and $Mn_3O_4$ have a lower polishing speed than $MnO_2$. Therefore, it is presumed that the chemical reaction between the particles and $Ga_2O_3$ does not occur or that the reaction speed is significantly slower.

Figure 4:
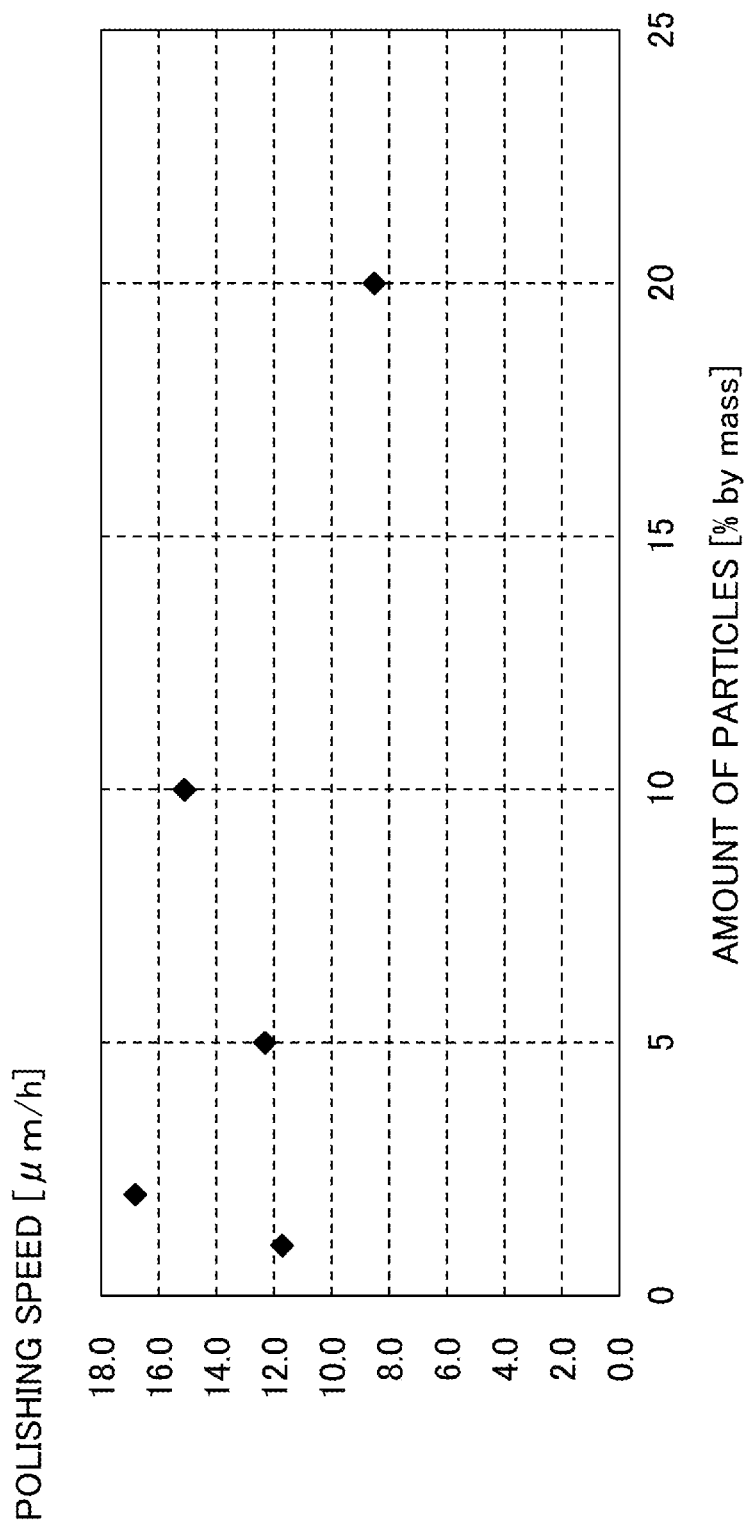
FIG. 4 is a figure illustrating the relationship between the amounts of particles and the polishing speed in Examples 1 to 5.

FIG. 4 illustrates the relationship between the amounts of particles and the polishing speed in Examples 1 to 5. As can be seen from Table 1, Examples 1 to 5 have in common that these Examples did not use a pH adjuster and differ in terms of the amounts of particles. The difference in pH is mainly due to the difference in the amounts of particles because these Examples did not use the pH adjuster in Examples 1 to 5.

As can be seen from FIG. 4, the polishing speed of Examples 1 to 5 was 6.0 μm/h or more because the amount of $MnO_2$ particles was 0.01% by mass or more and 50% by mass or less. The polishing speed of Example 10, in which diamond particles were used instead of $MnO_2$ particles, was 5.4 μm.

Figure 5:
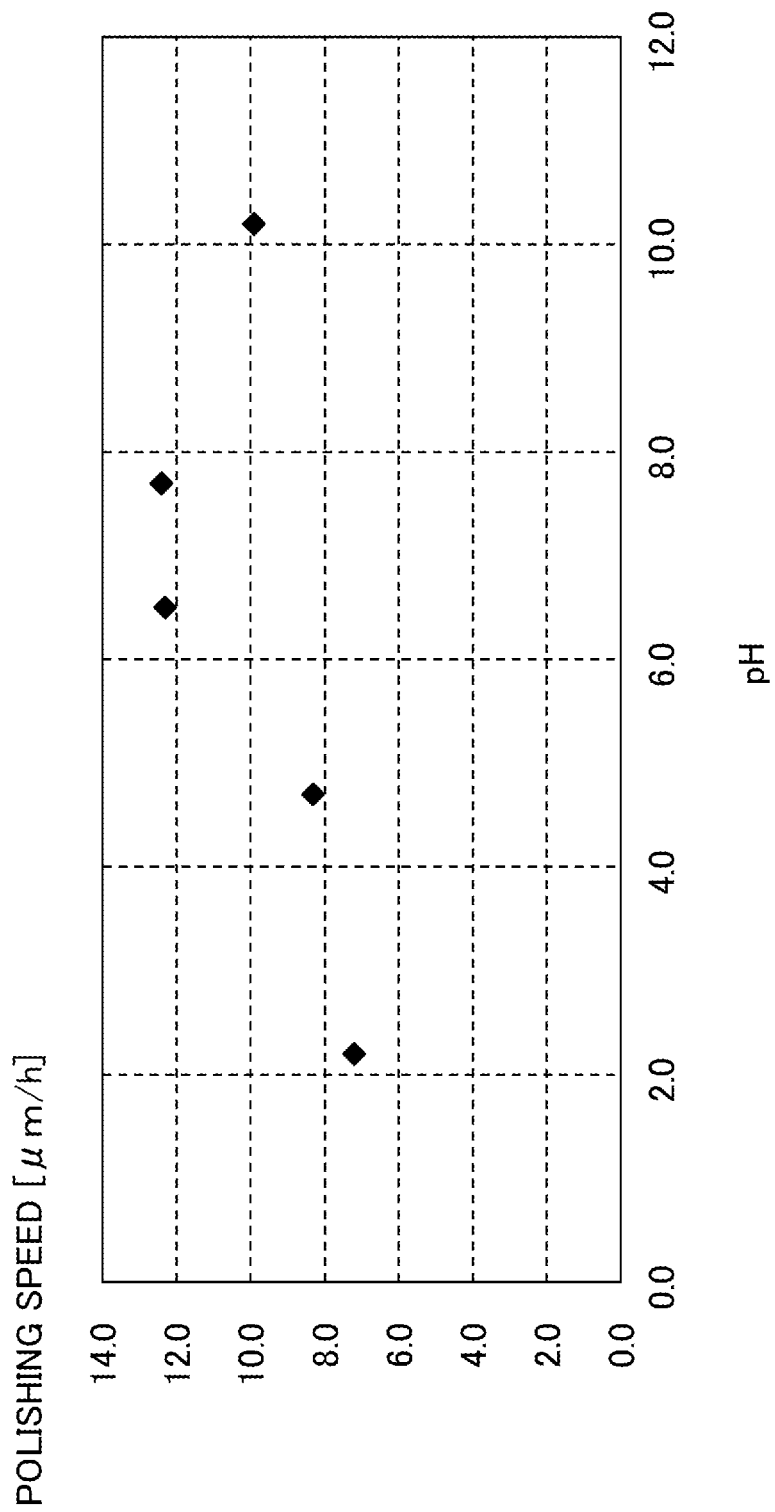
FIG. 5 is a figure illustrating the relationship between the pH and the polishing speed in Example 3 and Examples 6 to 9.

FIG. 5 illustrates the relationship between the pH and the polishing speed in Example 3 and Examples 6 to 9. As can be seen from Table 1, Example 3 and Examples 6 to 9 have in common that the particles are $MnO_2$ and the amount of particle is 5% by mass, but are different in terms of the presence or absence of the addition of pH adjuster and its additive amount. The difference in D50 is mainly due to the difference in pH because the same product of $MnO_2$ particles are used in Example 3 and Examples 6 to 9. The details will be explained later.

As can be seen from FIG. 5, the polishing speed of Example 3 and Examples 6 to 9 was 6.0 μm/h or more, even if these Examples are different in terms of the presence or absence of the addition of pH adjuster and its additive amount. It should be noted that the polishing speed of Example 10, in which diamond particles were used instead of $MnO_2$ particles, was 5.4 μm.

Examples 19 to 23

In Examples 19 to 23, polishing slurries containing 5% by mass of $MnO_2$ particles were prepared by changing whether the addition of pH adjuster is included or not and its additive amount. The polishing slurries of Examples 19 to 23 have in common that the particles are $Fe_2O_3$, in which the product name of the particles is MNO02PB, manufactured by High Purity Research Institute Co., Ltd. and the amount of particle is 5% by mass. The polishing slurries of Examples 19 to 23 are different in terms of the presence or absence of the addition of pH adjuster and its additive amount.

Figure 6:
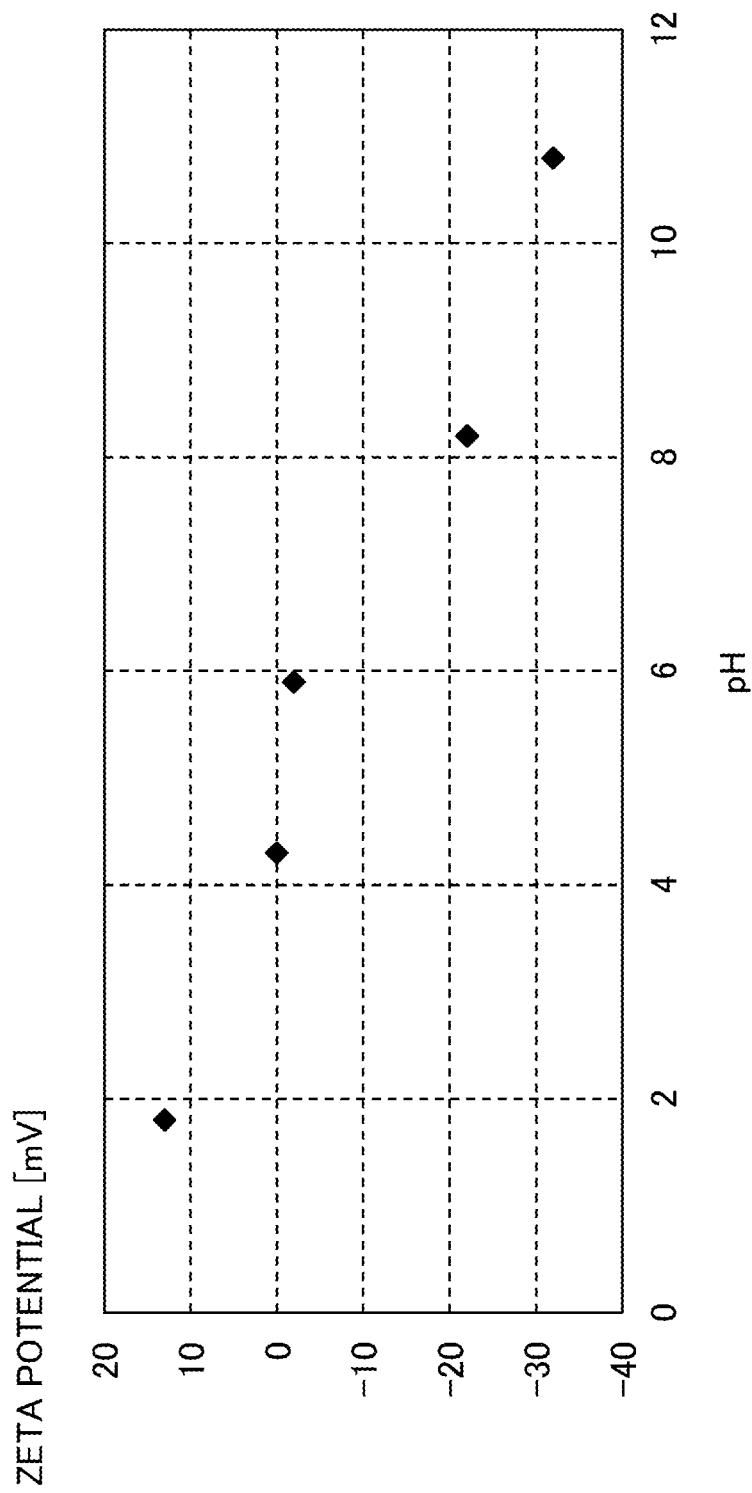
FIG. 6 is a figure illustrating the relationship between the pH and the zeta potential in Examples 19 to 23.
Figure 7:
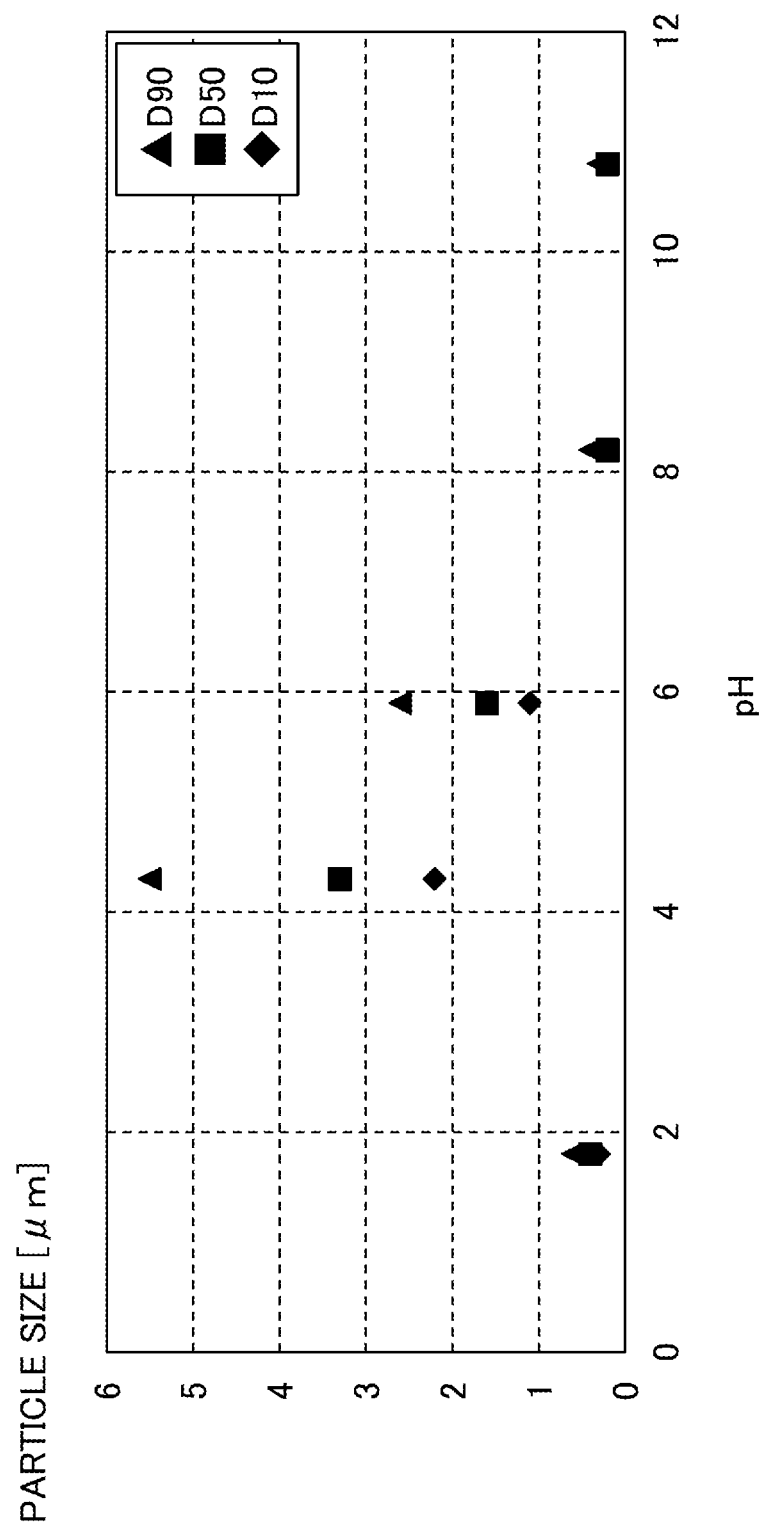
FIG. 7 is a figure illustrating the relationship between the pH and the particle size distribution in Examples 19 to 23.

The relationship of the pH, zeta potential, and particle size distribution is indicated in Table 3 and FIGS. 6 and 7. Table 3 indicates the relationship of the pH, zeta potential, and particle size distribution in Examples 19 to 23.

TABLE 3

|  | pH | Zeta potential [mV] | D10 [μm] | D50 [μm] | D90 [μm] |
| --- | --- | --- | --- | --- | --- |
| Example 19 | 1.8 | 13 | 0.3 | 0.4 | 0.6 |
| Example 20 | 4.3 | 0 | 2.2 | 3.3 | 5.5 |
| Example 21 | 5.9 | −2 | 1.1 | 1.6 | 2.6 |
| Example 22 | 8.2 | −22 | 0.2 | 0.2 | 0.4 |
| Example 23 | 10.8 | −32 | 0.2 | 0.2 | 0.3 |

D10, D50, and D90 were measured by irradiating the polishing slurry with laser light and observing the scattered light with a photodetector. D10 refers to the diameter at which the cumulative volume is 10% in the particle size distribution, D50 refers to the diameter at which the cumulative volume is 50% in the particle size distribution, and D90 refers to the diameter at which the cumulative volume is 90% in the particle size distribution.

The difference in the particle size distribution is mainly due to the difference in the degree of aggregation of the particles inside the polishing slurry because the same product of $MnO_2$ particles was used in Examples 19 to 23. Aggregation increases the apparent particle size, therefore, the difference between D10 and D90 becomes larger. The difference in the degree of aggregation is mainly due to the difference in pH.

The zeta potential was measured by emitting a laser light to particles that were set in motion by applying a voltage to the polishing slurry, and observing the change in frequency due to the Doppler effect with a photodetector.

FIG. 6 illustrates the relationship between pH and zeta potential for Examples 19 to 23. FIG. 7 also illustrates the relationship between pH and particle size distribution for Examples 19 to 23. When the pH is 1 or more and 3 or less as indicated in FIG. 6, the zeta potential of the $MnO_2$ particles becomes positive. The absolute value of the zeta potential of the particles is large, therefore, the particles repulse each other, leading to a small difference in D10 and D90 as illustrated in FIG. 7, and resulting in improving dispersibility. When the pH is 7 or more and 14 or less as indicated in FIG. 6, the zeta potential of the particles becomes negative. The absolute value of the zeta potential of the particles is large, therefore the particles repulse each other, leading to a small difference in D10 and D90 as illustrated in FIG. 7, and resulting in improving dispersibility. If the dispersibility is good, the storage of slurry become easier.

The method of manufacturing a gallium oxide substrate and the polishing slurry for a gallium oxide substrate according to the present disclosure were explain in the above, but the present disclosure is not limited to the above embodiments and the like. Various changes, modifications, substitutions, additions, deletions, and combinations are be made within the scope of subject matters described in the claims. These are naturally considered as being within the technical scope of the present disclosure.

For example, the polishing slurry of the present disclosure is used for primary polishing of a gallium oxide substrate in the above embodiment, but the polishing slurry may also be used for its secondary polishing. In other words, the method of producing gallium oxide may include polishing the gallium oxide substrate with another polishing slurry prior to polishing the gallium oxide substrate with the polishing slurry of the present disclosure.

What is claimed is:

1. A method of manufacturing a gallium oxide substrate, the method comprising:
   polishing a single crystal gallium oxide substrate with a polishing slurry,
   wherein the polishing slurry contains manganese dioxide particles and water, and
   wherein said polishing is performed at a polishing speed of at least 7.2 μm/h.

2. The method of claim 1, wherein an amount of the manganese dioxide particles contained in the polishing slurry is 0.01% by mass or more and 50% by mass or less.

3. The method of claim 1, wherein a pH of the polishing slurry is either 1 or more and 3 or less, or 7 or more and 14 or less.

4. The method of claim 1, wherein a diameter at which a cumulative volume is 50% in a particle size distribution of the manganese dioxide particles measured by a dynamic light scattering method is 1 nm or more and 2000 nm or less.

5. The method of claim 1, further comprising cleaning the single crystal gallium oxide substrate with a cleaning liquid after the polishing of the single crystal gallium oxide substrate.

6. The method of claim 5, wherein the cleaning liquid contains ascorbic acid, erythorbic acid, or a combination of both, and has a pH of 6 or less.

7. The method of claim 5, wherein the cleaning liquid contains sulfuric acid, hydrochloric acid, or a combination of both, and contains hydrogen peroxide.

8. The method of claim 1, wherein the single crystal gallium oxide substrate is a $\beta$-$Ga_2O_3$ single crystal substrate.

9. The method of claim 8, wherein the polishing comprises polishing the (001) plane of the $\beta$-$Ga_2O_3$ single crystal substrate.

10. The method of claim 1, wherein an amount of the manganese dioxide particles contained in the polishing slurry is 1% by mass or more and 20% by mass or less.

11. The method of claim 10, wherein a pH of the polishing slurry is 2.2 to 10.2.

12. The method of claim 11, wherein a diameter at which a cumulative volume is 50% in a particle size distribution of the manganese dioxide particles measured by a dynamic light scattering method is 200 nm or more and 2000 nm or less.

13. The method of claim 12, wherein said polishing is performed at a polishing speed of at least 7.2 μm/h.

14. The method of claim 1, wherein said polishing is a primary polishing, wherein the method further comprises a secondary polishing of the substrate, the secondary polishing is performed after said primary polishing.

15. The method of claim 14, wherein a D50 of particles using in the secondary polishing is smaller than a D50 of the manganese dioxide particles used in the primary polishing with the polishing slurry.

16. A method of manufacturing a gallium oxide substrate, the method comprising:
   polishing the gallium oxide substrate with a polishing slurry,
   wherein the polishing slurry contains manganese dioxide particles and water and a pH of the polishing slurry is 1 or more and 3 or less, and
   wherein said polishing is performed at a polishing speed of at least 7.2 μm/h.

17. The method of claim 16, wherein an amount of the manganese dioxide particles contained in the polishing slurry is 0.01% by mass or more and 50% by mass or less.

18. The method of claim 16, wherein a diameter at which a cumulative volume is 50% in a particle size distribution of the manganese dioxide particles measured by a dynamic light scattering method is 1 nm or more and 2000 nm or less.

19. The method of claim 16, further comprising cleaning the gallium oxide substrate with a cleaning liquid after the polishing of the gallium oxide substrate.

20. The method of claim 19, wherein the cleaning liquid contains ascorbic acid, erythorbic acid, or a combination of both, and has a pH of 6 or less.

21. The method of claim 19, wherein the cleaning liquid contains sulfuric acid, hydrochloric acid, or a combination of both, and contains hydrogen peroxide.

22. The method of claim 16, wherein the gallium oxide substrate is a single crystal gallium oxide substrate.

\* \* \* \* \*